(12) United States Patent
Hu et al.

(10) Patent No.: US 11,424,374 B2
(45) Date of Patent: Aug. 23, 2022

(54) CAMERA MODULE OPTICAL SYSTEM

(71) Applicant: TDK TAIWAN CORP., Taoyuan (TW)

(72) Inventors: Chao-Chang Hu, Taoyuan (TW); Chih-Wei Weng, Taoyuan (TW); Shu-Shan Chen, Taoyuan (TW); Yung-Hsien Yeh, Taoyuan (TW); Sin-Jhong Song, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 2 days.

(21) Appl. No.: 16/742,401

(22) Filed: Jan. 14, 2020

(65) Prior Publication Data

US 2020/0336629 A1 Oct. 22, 2020

Related U.S. Application Data

(60) Provisional application No. 62/836,405, filed on Apr. 19, 2019.

(30) Foreign Application Priority Data

Dec. 20, 2019 (EP) .................................... 19218896

(51) Int. Cl.
*H04N 5/225* (2006.01)
*H01L 31/0232* (2014.01)
(Continued)

(52) U.S. Cl.
CPC ........ *H01L 31/02327* (2013.01); *G02B 7/003* (2013.01); *G02B 7/09* (2013.01);
(Continued)

(58) Field of Classification Search
CPC ...... H04N 5/2254; H04N 5/2257; G03B 5/00; G03B 5/02; G02B 7/003; G02B 7/004; G02B 7/005
See application file for complete search history.

(56) References Cited

U.S. PATENT DOCUMENTS 9,196,761 B2 * 11/2015 Hata .................... H01L 31/0203
2008/0025678 A1 * 1/2008 Yabe .................... H01L 31/0203
385/94

(Continued)

FOREIGN PATENT DOCUMENTS

KR 20180059301 A * 6/2018

OTHER PUBLICATIONS

Machine translation of KR 10-2018-0059301 (Jun. 4, 2018) which was generated on Mar. 11, 2021.*

*Primary Examiner* — Daniel M Pasiewicz
(74) *Attorney, Agent, or Firm* — Muncy, Geissler, Olds & Lowe, P.C.

(57) ABSTRACT

A camera module optical system is provided, having a main axis, including an optical module and an adjustment assembly. The optical module is configured to hold an optical element having an optical axis. The adjustment assembly is configured to adjust the optical axis of the optical module parallel to the main axis. The optical module and the adjustment assembly are arranged along the main axis, wherein the adjustment assembly does not overlap the optical module when viewed in a first direction that is perpendicular to the main axis.

19 Claims, 8 Drawing Sheets

(51) Int. Cl.
  H01L 31/113     (2006.01)
  H01L 31/0236    (2006.01)
  H01L 31/02      (2006.01)
  H01L 27/146     (2006.01)
  H01L 31/0224    (2006.01)
  H01L 31/024     (2014.01)
  G03B 5/00       (2021.01)
  G03B 5/02       (2021.01)
  G03B 5/04       (2021.01)
  G02B 7/182      (2021.01)
  H02K 11/21      (2016.01)
  G02B 7/09       (2021.01)
  G02B 27/64      (2006.01)
  G03B 13/36      (2021.01)
  H02K 41/035     (2006.01)
  G02B 7/00       (2021.01)
  H01L 23/00      (2006.01)
  G02B 13/00      (2006.01)

(52) U.S. Cl.
  CPC ......... *G02B 7/1821* (2013.01); *G02B 27/646* (2013.01); *G03B 5/00* (2013.01); *G03B 5/02* (2013.01); *G03B 5/04* (2013.01); *G03B 13/36* (2013.01); *H01L 27/14618* (2013.01); *H01L 27/14636* (2013.01); *H01L 31/02002* (2013.01); *H01L 31/024* (2013.01); *H01L 31/02016* (2013.01); *H01L 31/02366* (2013.01); *H01L 31/022466* (2013.01); *H01L 31/1136* (2013.01); *H02K 11/21* (2016.01); *H02K 41/0356* (2013.01); *H04N 5/2253* (2013.01); *H04N 5/2254* (2013.01); *H04N 5/2257* (2013.01); *G02B 13/0045* (2013.01); *G03B 2205/0007* (2013.01); *G03B 2205/0069* (2013.01); *H01L 24/48* (2013.01); *H01L 2224/48091* (2013.01); *H01L 2224/48106* (2013.01); *H01L 2224/48225* (2013.01)

(56)         References Cited

U.S. PATENT DOCUMENTS

| | | | | |
|---|---|---|---|---|
| 2008/0144196 | A1* | 6/2008 | Kitamura | B29C 65/4845 359/819 |
| 2009/0262509 | A1* | 10/2009 | Saji | H01S 5/02253 361/809 |
| 2018/0246290 | A1* | 8/2018 | Wang | G02B 7/025 |

* cited by examiner

CAMERA MODULE OPTICAL SYSTEM

CROSS REFERENCE TO RELATED APPLICATIONS

This application claims the benefit of U.S. Provisional Application No. 62/836,405, filed on Apr. 19, 2019, and European Patent Application No. 19218896.9, filed on Dec. 20, 2019, the entirety of which is incorporated by reference herein.

BACKGROUND OF THE INVENTION

Field of the Invention

The application relates in general to a camera module optical system, and in particular to a camera module optical system that includes an elastic assembly and a driving assembly.

Description of the Related Art

Thanks to ongoing technological developments, recent electronic devices (such as tablet computers and smartphones) usually include a lens module capable of aiding in photography or recording video, and some are even equipped with dual lens modules, bringing users a wealth of visual enjoyment. However, an image may come out blurry if the user shakes the lens module in the electronic device when using it. To improve image quality, it is increasingly important to design an effectively shockproof lens module. In addition, designers are currently pursuing the miniaturization of such devices, and it is expected that electronic products will be smaller and lighter with each successive generation. Therefore, how to design an optical mechanism with a better optical compensation function with a smaller volume through a special configuration is an important issue.

Some camera modules are equipped with a plurality of lens elements. For high resolution, it requires higher levels of optical drive, stability and alignment, and the performance quality of Modulation Transfer Function (MTF) can be improved. The aperture performance of some lens elements requires a large aperture type product due to low light quality requirements, but the depth of focus range of the through of focus (TOF) becomes narrower. For the assembly of related components, if the lens element and the image sensor cannot be perpendicular to each other, it means that there is a tilt angle with the optical axis. If the tilt angle is too large, the TOF curve is scattered, causing the image to be out of focus and blurred. Therefore, it is an important issue to control the tilt angle between the lens element and the image sensor.

BRIEF SUMMARY OF INVENTION

To address the deficiencies of conventional products, an embodiment of the invention provides a camera module optical system, having a main axis, including an optical module and an adjustment assembly. The optical module is configured to hold an optical element having an optical axis. The adjustment assembly is configured to adjust the optical axis of the optical module parallel to the main axis. The optical module and the adjustment assembly are arranged along the main axis, wherein the adjustment assembly does not overlap the optical module when viewed in a first direction that is perpendicular to the main axis.

In some embodiments, the optical module includes a movable portion and a base, the movable portion has a holder and a driving assembly, wherein the holder is configured to sustain the optical element, and the driving assembly is configured to drive the holder to move relative to the base. The optical module has a bottom surface, and the adjustment assembly is located on the bottom of the optical module. The camera module optical system further comprises an image sensor module, wherein the optical module, the adjustment assembly and the image sensor module are sequentially arranged along the main axis.

In some embodiments, the adjustment assembly includes a plurality of adjustment columns extending along a second direction, and the second direction is not perpendicular to the optical axis. The adjustment assembly includes at least three adjustment columns which are located on different sides of a bottom surface of the optical module, and are disposed at edges of the bottom surface. The ends of the adjustment columns have a stepped structure. The adjustment columns have a cylindrical or trapezoidal structure.

In some embodiments, the image sensor module has a contact surface, the adjustment assembly is located between the optical module and the contact surface, and the adjustment assembly contacts the contact surface. The contact surface has a metal material. The contact surface is flat.

In some embodiments, the contact surface has a plurality of protrusions extending toward the optical module, the adjustment assembly corresponds to and contacts the protrusions, and the maximum width of each protrusion is greater than the maximum width of the adjustment assembly. The contact surface has a plurality of recesses, and openings of the recesses face the optical module, the adjustment assembly corresponds to and contacts the recesses, and the maximum width of each recess is greater than the maximum width of the adjustment assembly.

In some embodiments, the camera module optical system further comprises an assembly and adjustment mechanism that clamps the optical module and carries the image sensor module, wherein the assembly and adjustment mechanism applies a force to the image sensor module toward the optical module, and adjusts the shape of the adjustment assembly, so that the optical axis is parallel to the main axis.

Another embodiment of the invention provides a camera module optical system, having a main axis, including a first optical module, configured to carry a first optical element having a first optical axis; a second optical module, configured to carry a second optical element having a second optical axis; and an adjustment assembly, configured to adjust the first optical axis and the second optical axis parallel to the main axis, and includes an adjustment sub-assembly located between the first optical module and the second optical module, wherein when viewed from a first direction that is perpendicular to the main axis, the first adjustment sub-assembly does not overlap the first optical module or the second optical module.

In some embodiments, the camera module optical system further comprises a image sensor module, the image sensor module has the main axis, and the adjustment assembly further includes a second adjustment sub-assembly, wherein the first optical module, the second optical module, and the image sensor module are sequentially arranged along the main axis, the second adjustment sub-assembly is located between the second optical module and the image sensor module, and is configured to adjust the second optical axis parallel to the main axis, wherein when viewed along the first direction perpendicular to the main axis, the second adjustment sub-assembly does not overlap the second optical module.

In some embodiments, the first adjustment sub-assembly is disposed on an upper surface of the second optical module and at least partially contacts a bottom surface of the first optical module, and the upper surface and the bottom surface face each other. The first adjustment sub-assembly is disposed on a bottom surface of the first optical module, and at least partially contacts an upper surface of the second optical module, and the bottom surface and the upper surface face each other.

In some embodiments, the second adjustment sub-assembly is disposed on a lower surface of the second optical module and at least partially contacts a surface of the image sensor module, and the lower surface and the surface of the image sensor module face each other. The camera module optical system further comprises an assembly and adjustment mechanism for adjusting the shape of the adjustment assembly and to make the first optical axis and the second optical axis parallel to the main axis.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the optical systems are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
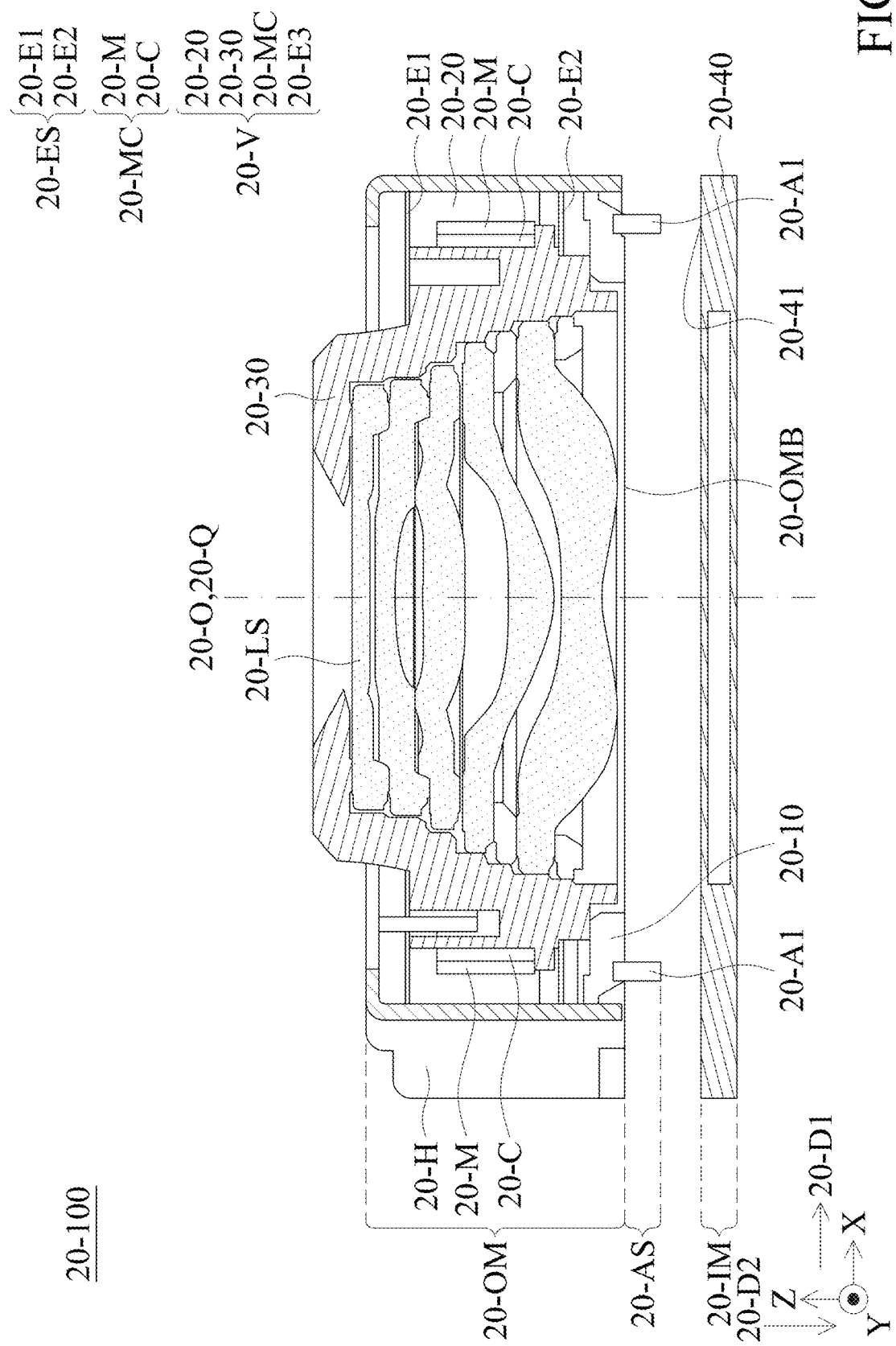
FIG. 1 is a schematic sectional view of the optical module, the adjustment assembly, and the image sensor module of the camera module optical system according to an embodiment of the present invention.

Referring to FIG. 1, FIG. 1 is a schematic view showing the camera module optical system 20-100. The camera module optical system 20-100 can be used, for example, to drive and sustain an optical element 20-LS (such as a lens assembly), and can be disposed inside an electronic device (such as a camera, a tablet or a mobile phone). When light (incident light) from the outside enters the camera module optical system 20-100, the light can pass through the optical element 20-LS to an image sensor module 20-IM to obtain an image. The detailed structure of the camera module optical system 20-100 will be described below.

The camera module optical system 20-100 comprises an optical module 20-OM, a image sensor module 20-IM, and an adjustment assembly 20-AS. The adjustment assembly 20-AS is located between the optical module 20-OM and the image sensor module 20-IM, and disposed on a bottom surface 20-OMB of the optical module 20-OM. Viewing along a first direction 20-D1 that is perpendicular to a main axis 20-Q of the optical system 20-100 (or perpendicular to an optical axis 20-O of the optical element 20-LS), the adjustment assembly 20-AS does not overlap the optical module 20-OM.

The aforementioned optical module 20-OM may be a lens module including a housing 20-H, a movable portion 20-V and a base 20-10. The housing 20-H and the movable portion 20-V are disposed on the base 20-10, the housing 20-H and the base 20-10 form an accommodating space, and the movable portion 20-V is disposed in the accommodating space. The movable portion 20-V includes a frame 20-20, a holder 20-30, a driving assembly 20-MC, and an elastic assembly 20-ES. The accommodating space formed by the housing 20-H connected to and disposed on the base 20-10 can receive the movable portion 20-V (including the holder 20-30, the drive assembly 20-MC and elastic assembly 20-ES) for protection.

The holder 20-30 is used to carry the optical element 20-LS, and is movably connected to the base 20-10 and the frame 20-20 through the elastic assembly 20-ES. The driving assembly 20-MC is disposed on the holder 20-30 and the frame 20-20, and is used to drive the holder 20-30 and the optical element 20-LS to move relative to the base 20-10 and the frame 20-20 to adjust the posture or position of the optical element 20-LS, thereby achieving the purpose of optical auto-focusing (AF) or optical image stabilization (OIS).

In detail about the elastic assembly 20-ES, the elastic assembly 20-ES includes a first elastic element 20-E1 and a second elastic element 20-E2, which are respectively disposed on the upper and lower sides of the holder 20-30, and movably connected to the holder 20-30, the base 20-10 and the frame 20-20, so that the holder 20-30 can move relative to the base 20-10 and the frame 20-20.

The aforementioned driving assembly 20-MC may be an electromagnetic driving assembly, which includes a magnetic element 20-M and a coil 20-C, which are respectively disposed on the bottom surface 20-30B of the movable portion 20-30 and base 20-11 and arranged along the extension direction 24-DE. The magnetic element 20-M and the coil 20-C correspond to each other. When a driving signal is applied to the driving assembly 20-MC (for example, by applying an electric current through an external power source to the coil 20-C), a magnetic force is generated between the magnetic element 20-M and the coil 20-C, thereby the driving assembly 20-MC can drive the movable portion 20-30 to move relative to the base 20-10, to achieve the effect of anti-shake or auto-focus of optical image. In this embodiment, the driving assembly 20-MC is a moving coil type; in another embodiment, it may be a moving magnetic type. In addition, before the driving signal is applied, the aforementioned elastic assembly 20-ES can keep the movable portion in an initial position relative to the base 20-10.

In some embodiments, the driving mechanism 20-100 may include a position sensing element, which may be a position sensor, for example, a magnetoresistive sensor (MRS) or optical sensor, for sensing the relative positional relationship between the movable portion 20-V and the base 20-10, to facilitate a control unit to adjust the positions between the two via the driving assembly 20-MC. The position sensing element can be surrounded by the coil 20-C. This configuration can make full use of space and make the size of the entire driving mechanism small. The position sensing element may share the magnetic element 20-M with the coil 20-C.

In some embodiments, the camera module optical system 20-100 may further include a permeability element disposed between the frame 20-20 and the magnetic element 20-M of the driving assembly 20-MC. The magnetic force can be concentrated in a predetermined direction, so as to enhance the magnetic driving force of the driving assembly 20-MC for driving the holder 20-30, and reduce the effect of magnetic interference. In another embodiment, the frame 20-20 can be embedded with the aforementioned permeability element so that it has a permeability material. In addition to strengthening the magnetic force (between the magnetic element 20-M and the coil 20-C) in a predetermined direction, it can also enhance the overall mechanical strength of the movable portion 20-V.

Figure 2:
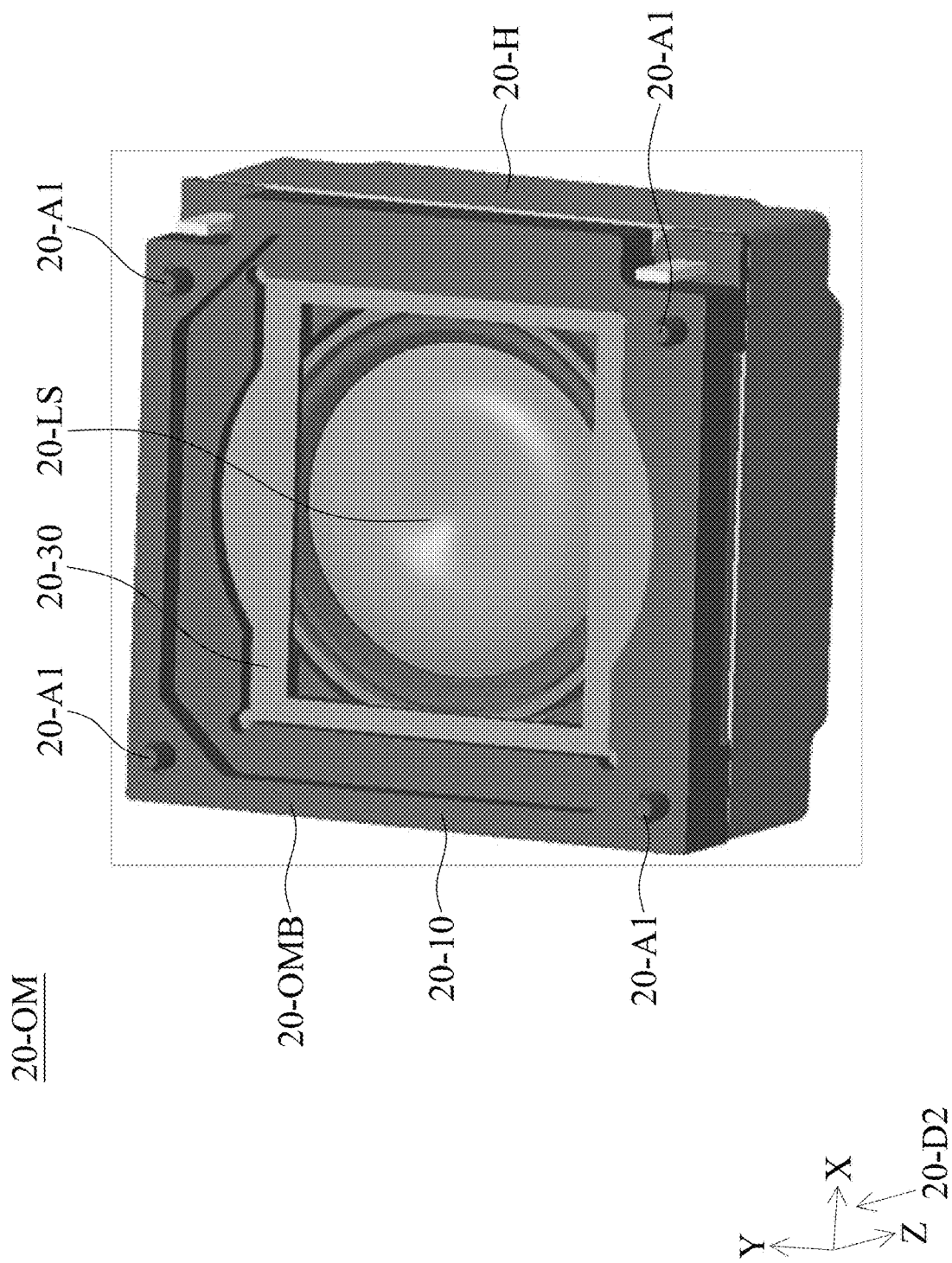
FIG. 2 is a perspective bottom view of the optical module in FIG. 1.

Referring to FIG. 2, the aforementioned adjustment assembly 20-AS includes a plurality of adjustment columns 20-A1, which are disposed on the bottom surface 20-OMB of the base 20-10 and extend along a second direction 20-D2 (the second direction 20-D2 is not perpendicular to the optical axis 20-O, such as parallel or approximately parallel to the Z axis), and is used to adjust the relative positions of the optical module 20-OM and the image sensor module 20-IM. Specifically, the adjustment assembly 20-AS are used to adjust the optical axis 20-O of the optical element 20-LS set in the optical module 20-OM and the main axis 20-Q of the image sensor module 20-IM so that they overlap or are parallel. In this embodiment, the adjustment assembly 20-AS includes four adjustment columns 20-A1, which are disposed at the edges of the bottom surface 20-OMB of the optical module 20-OM and located on different sides of the bottom surface 20-OMB. It should be noted that, in other embodiments, the adjusting assembly 20-AS may include three adjusting columns 20-A1, which are disposed at the edges of the bottom surface 20-OMB of the optical module 20-OM, and all three are located on the different sides of the bottom surface 20-OMB.

Figure 3A:
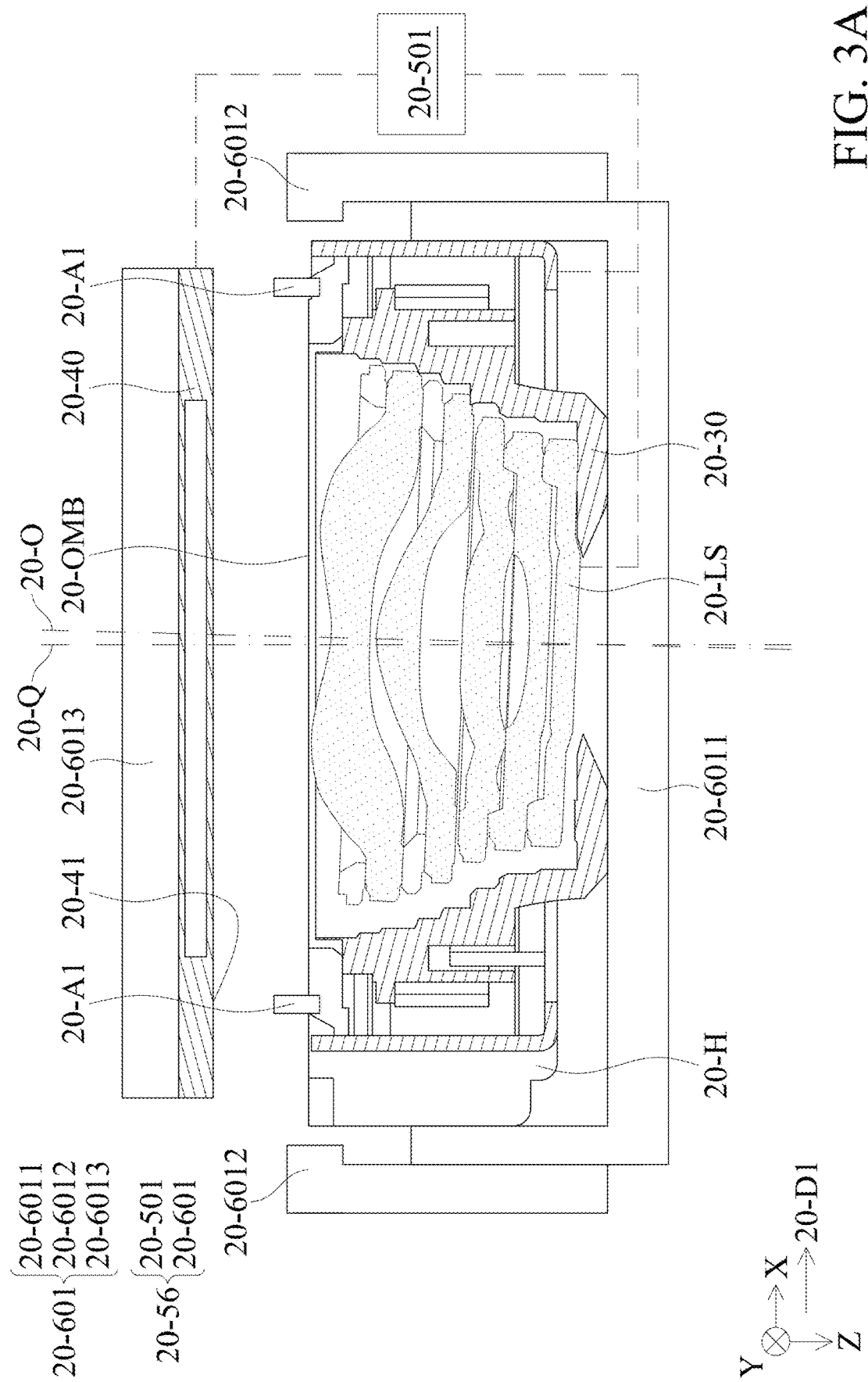
FIGS. 3A and 3B are schematic diagrams showing that the optical element in the optical module of the optical system in FIG. 1 are relatively inclined with respect to the image sensor module, and undergo adjustment process.

In detail, referring to FIG. 3A, when the image sensor module 20-IM and the optical module 20-OM are assembled, the contact surface 20-41 of the bottom plate 20-40 of the image sensor module 20-IM (can be used to carry an image sensor of the image sensor module in the 20-IM) will be in contact with the adjustment assembly 20-AS. At this time, a measuring device 20-501 (for example, an angle measuring device) of the assembly and adjustment mechanism 20-56 measures the angle difference between the optical axis 20-O of the optical module 20-OM and the main axis 20-Q of the image sensor module 20-IM, to provide a measurement information. Next, a positioning device 20-601 of the assembly and adjustment mechanism 20-56 adjusts the relative positions between the optical module 20-OM and the image sensor module 20-IM according to the aforementioned measurement information, so that the optical axis 20-O and the main axis 20-Q coincide or are parallel. In some embodiments, the measurement device 20-501 can determine an angle difference between the optical axis 20-O in the optical module 20-OM and the main axis 20-Q of the image sensor module 20-IM according to the degree of blur and focus of the image generated by the incident light passing through the optical module 20-OM to the image sensor module 20-IM.

Figure 3B:
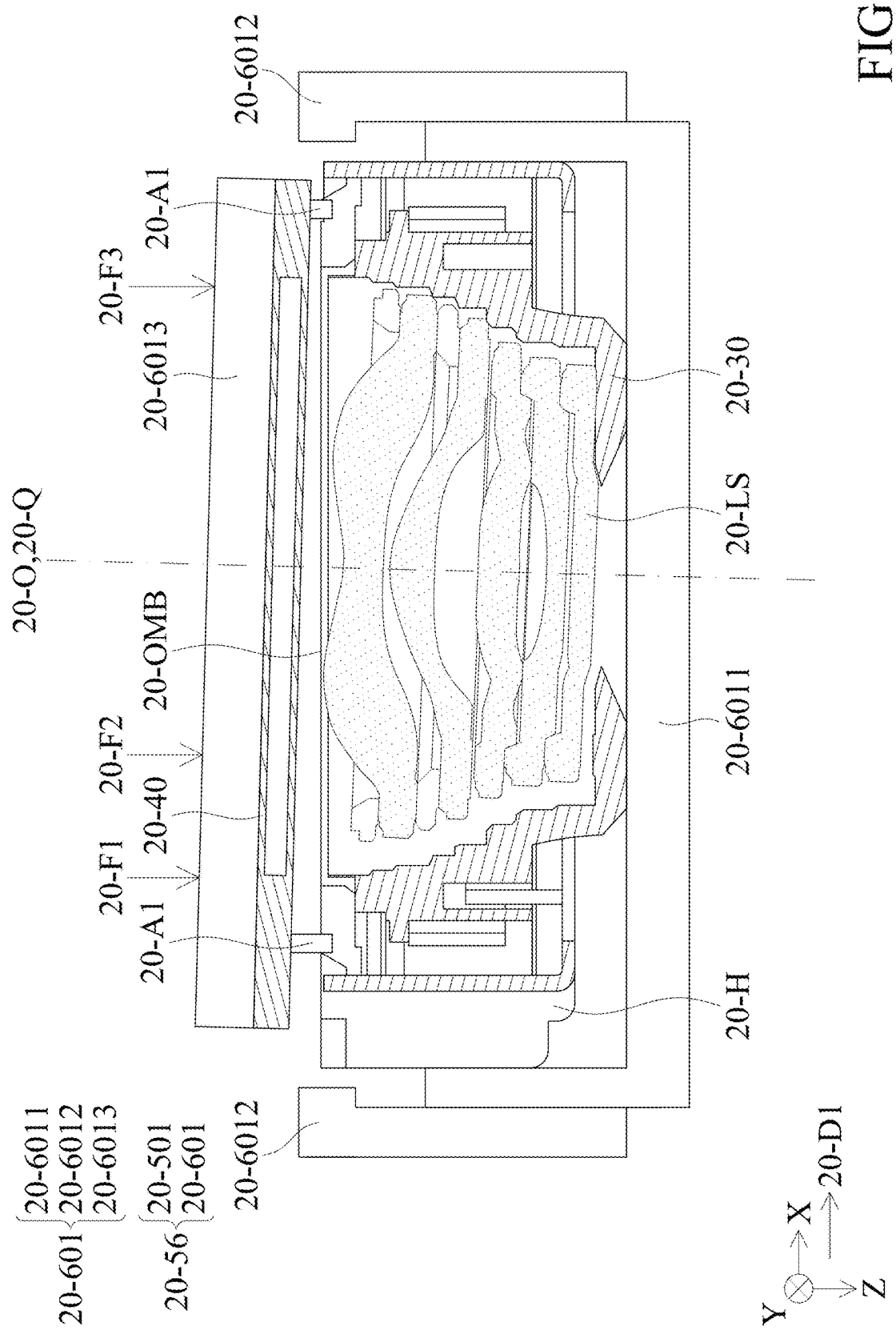

Continuing to refer to FIG. 3A, when the main axis 20-Q is relatively inclined or skewed relative to the optical axis 20-O (for example, the optical element 20-LS placed in the holder 20-30 and is not fully aligned with the center of the holder 20-30 will make the optical axis 20-O, the center of the holder 20-30 and the main axis 20-Q not parallel or coincide), which means that the image sensor module 20-IM is not aligned with the optical module 20-OM. In this situation, the positioning device 20-601 drives the image sensor module 20-IM to squeeze the adjustment assembly 20-AS to deform, so that the height of at least a part of the adjustment assembly 20-AS in the Z-axis direction is reduced, to make the image sensor module 20-IM align the optical module 20-OM. As shown in FIGS. 3A to 3B, when the image sensor module 20-IM squeezes the adjustment assembly 20-AS, its bottom plate 20-40 contacts and presses against the aforementioned adjustment columns 20-A1, so that the adjustment columns 20-A1 changes its original shape. At this time, the positioning device 20-601 is used to align the image sensor module 20-IM with the optical module 20-OM to achieve alignment between the two components.

The positioning device 20-601 includes a holding (or clamping) member 20-6011, a limiting member 20-6012, and a positioning member 20-6013. The holding member 20-6011 is used to hold the optical module 20-OM. The limiting member 20-6012 is used to limit the optical module 20-OM, and the positioning member 20-6013 is used to carry the image sensor module 20-IM and assemble it to the optical module 20-OM. In this embodiment, the holding member 20-6011 holds the top portion of the optical module 20-OM, and the limiting member 20-6012 are located on both sides of the optical module 20-OM to limit the optical module 20-OM. Avoid excessive shaking or movement. When the positioning member 20-6013 pushes the image sensor module 20-IM toward the optical module 20-OM, the bottom plate 20-40 of the image sensor module 20-IM contacts the adjustment columns 20-A1, and the measuring device 20-501 determines whether the optical axis 20-O and main axis 20-Q are parallel or coincide, to adjust the forces for the image sensor module 20-IM pressing toward the adjustment columns 20-A1 at different positions, such as different forces 20-F1, 20-F2 and 20-F3, so that the shapes of the adjustment columns 20-A1 are changed (or the shape of at least one column 20-A1 is changed due to the angle difference), to make the optical axis 20-O and the main axis 20-Q be parallel or coincide.

In some embodiments, the contact surface 20-41 of the bottom plate 20-40 includes a metal material, which can be connected to an external heating circuit to heat up, so that the adjustment column 20-A1 on the contact surface 20-41 becomes a molten state, for changing its shape. In some embodiments, the contact surface 20-41 is flat.

In this way, the camera module optical system 20-100 is provided with an adjustment assembly 20-AS located between the optical module 20-OM and the image sensor module 20-IM, and the shape of the adjustment assembly AS can be changed. The assembly of the correction in image sensor module IM and the optical module 20-OM can be accurately adjusted so that the main axis 20-Q can be parallel or coincident with the optical axis 20-O, to improve the image quality obtained by the device.

Figure 4:
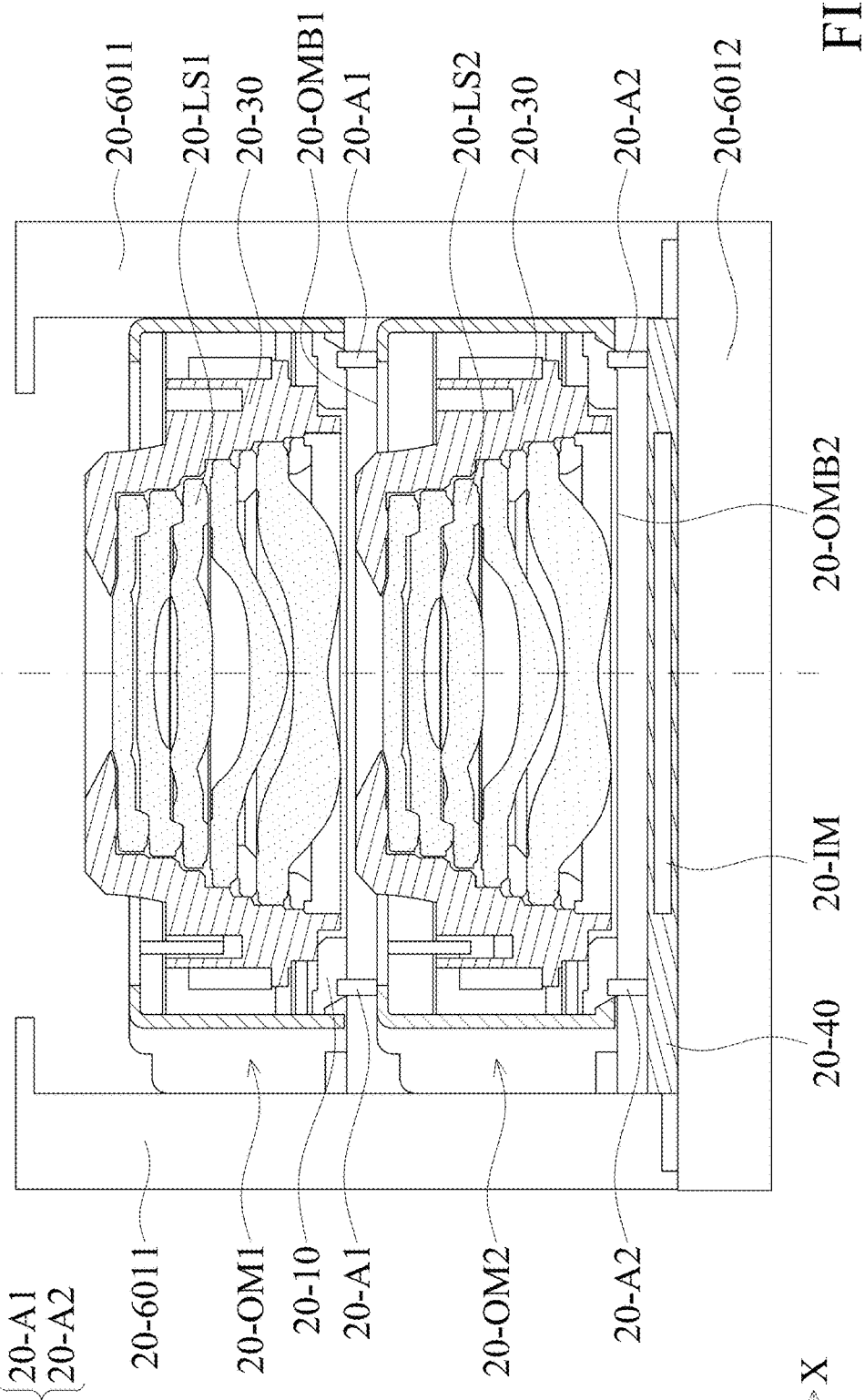
FIG. 4 is a schematic diagram of the camera module optical system according to another embodiment of the present invention.

FIG. 4 shows a camera module optical system 20-200 and adjustment according to another embodiment of the present invention, which is different from the camera module optical system 20-100 in FIG. 1. The camera module optical system 20-200 in this embodiment has two optical modules: a first optical module 20-OM1 and a second optical module 20-OM2, both of which may be the same or similar, or they may have a slightly different appearance and proportions. The adjustment assembly 20-AS has a plurality of first adjustment columns 20-A1 (first adjustment sub-assembly) and a plurality of second adjustment columns A2 (second adjustment sub-assembly). The first optical module 20-OM1, the first adjustment columns 20-A1, a second optical module 20-OM2, the second adjustment columns 20-A2, and the image sensor module 20-IM are sequentially arranged along the first optical axis 20-O1 of the first optical element 20-LS1 (or the second optical axis 20-O2 of the second optical element LS2, the main axis 20-Q).

When it is intended to assemble the first and second optical modules 20-OM1, 20-OM2, and the image sensor module 20-IM, the holding member 20-6011 of the positioning device 601 clamps and limits the first and the second optical module 20-OM1, 20-OM2, and the positioning member 20-6012 carry the image sensor module 20-IM. First, the first adjustment columns 20-A1 on the upper surface 20-OMB1 of the second optical module 20-OM2 is pressed against the bottom surface of the base 20-10 of the first optical module 20-OM1. When 20-OM1 and 20-OM2 are relatively inclined, the shape of the first adjustment columns 20-A1 are configured to change via the first adjustment assembly 20-A1 being contact with the base 20-10, so that to performance the alignment of the first and second optical modules 20-OM1 and 20-OM2.

Next, the bottom plate 20-40 of the image sensor module 20-IM is pressed against the second adjustment columns 20-A2 provided on the lower surface 20-OMB2. When the image sensor module 20-IM and the second optical module 20-OM2 are relatively inclined, the second adjustment columns 20-A2 are pressed against the bottom plate 20-40 to change its shape until the image sensor module 20-IM is aligned with the second optical module 20-OM2. In this way, through the above mechanism, the first and second optical modules 20-OM1, 20-OM2, and the image sensor module 20-IM can be aligned, and the first and second optical axes 20-O1, 20-O2 are parallel or coincident with the main axis 20-Q.

In other embodiments, the first adjustment columns 20-A1 may be disposed on the bottom surface of the first optical module 20-OM1, and the upper surface 20-OMB1 of the second optical module 20-OM2 is pressed toward the first adjustment columns 20-A1. In other embodiments, the second adjustment columns 20-A2 may be disposed on the bottom plate 20-40 of the image sensor module 20-IM, and the lower surface 20-OMB2 of the second optical module 20-OM2 is pressed toward the second adjustment columns 20-A2.

The positions of the first and second adjustment columns 20-A1 and 20-A2 described above can be combined or mixed, and the first and second optical modules 20-OM1, 20-OM2, and the image sensor module 20-IM as active movers can also be combined or mixed.

Figure 5:
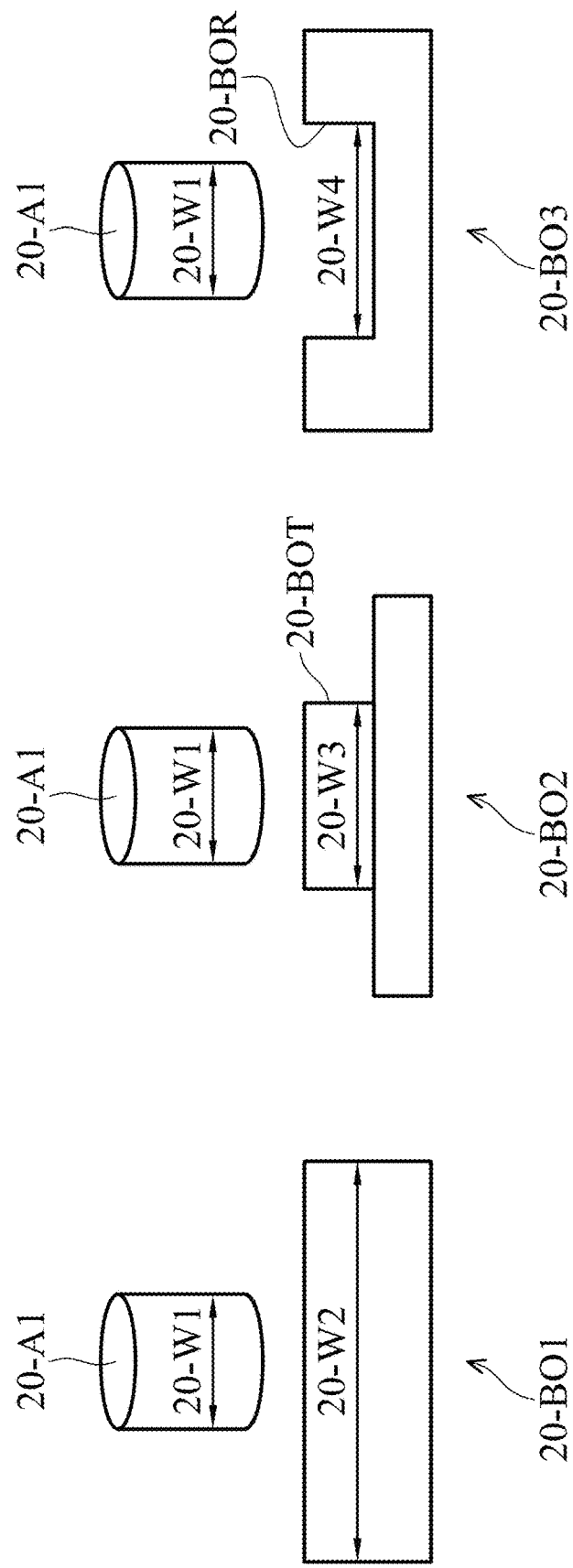
FIG. 5 is schematic diagram of the adjustment column and several different opponent members.

FIG. 5 shows a schematic diagram of adjustment columns 20-A1 (or may be 20-A2) and several different opponent members 20-BO1, 20-BO2, and 20-BO3. The opponent members 20-BO1 to BO3 can be the bottom 20-40 of the image sensor module 20-IM in FIG. 3A, or the base 20-10 of the first optical module 20-OM1, parts of the upper and lower surfaces 20-OMB1, 20-OMB2 of the second optical module 20-OM2 or the bottom plate 20-40 of the image sensor module 20-IM in FIG. 4.

In this embodiment, the adjustment column 20-A1 has a cylindrical structure having a maximum width of 20-W1, and the contact surface of the opponent member 20-BO1 has a maximum width of 20-W2, where the width 20-W1 is smaller than the width 20-W2, or say the maximum width 20-W2 is larger than the maximum width 20-W1. This can ensure that when the opponent member 20-BO1 is pressed against the adjustment column 20-A1, it can completely cover the adjustment column 20-A1, so as to change the shape of the adjustment column 20-A1 and improve the alignment accuracy between the modules.

In some embodiments, the opponent member 20-BO2 has protrusions 20-BOT extending toward the adjustment column 20-A1 (or 20-A2). With the embodiments in FIGS. 1 and 4, for example, it extends toward the optical module 20-OM, 20-OM1, 20-OM2, or the image sensor module 20-IM. The plurality of adjusting columns 20-A1 correspond to and contact the plurality of protrusions 20-BOT, and the maximum width 20-W3 of the protrusion 20-BOT is larger than the maximum width 20-W1 of the adjustment column 20-A1. For clarity and simplicity, only one adjustment column 20-A1 and one protrusion 20-BOT are shown in FIG. 5.

In some embodiments, the opponent member 20-BO3 has a plurality of recesses 20-BOR, the openings of which are directed toward the optical module 20-OM (or 20-OM1, 20-OM2, or the image sensor module 20-IM), the plurality of adjustment columns 20-A1 correspond to and contact the recesses 20-BOR, and the maximum width 20-W4 of the recess 20-BOR is larger than the maximum width 20-W1 of the adjustment column 20-A1.

Figure 6:
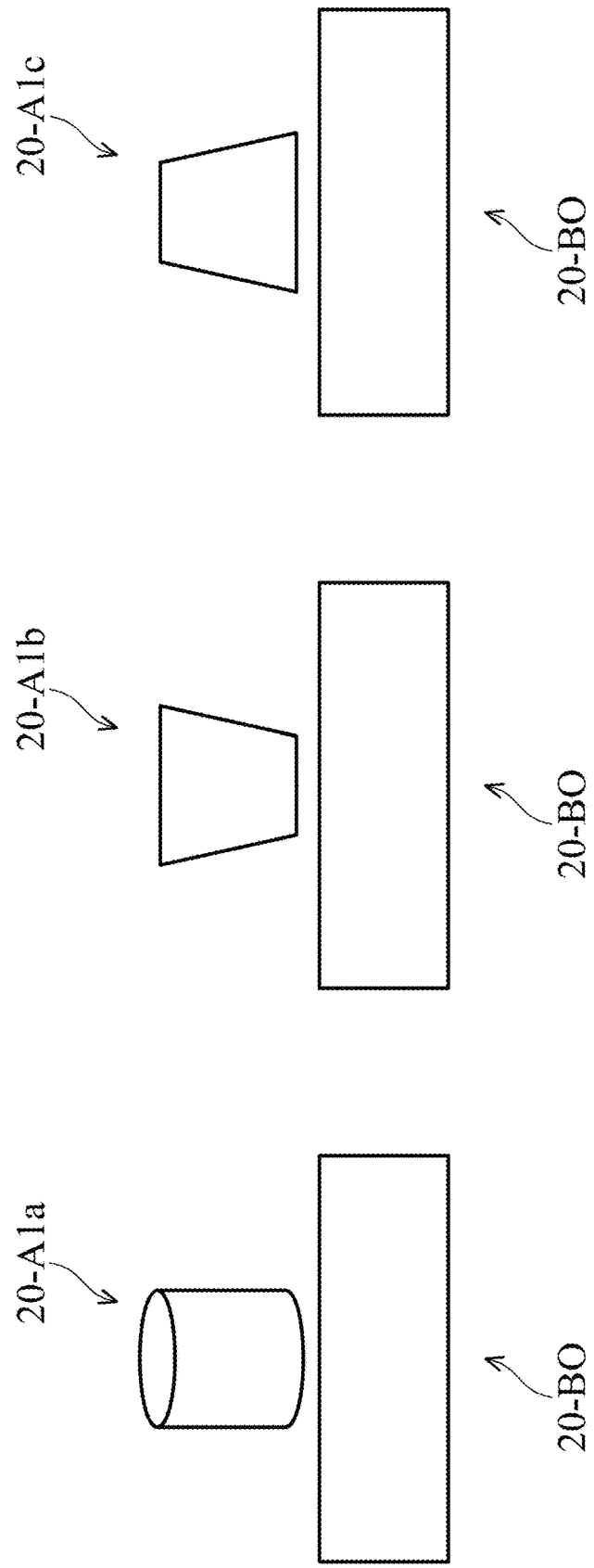
FIG. 6 is a schematic diagram showing a plurality of adjusting columns having different shapes.

FIG. 6 shows a schematic diagram of plurality of adjustment columns having different shapes, including: 20-A1$a$, 20-A1$b$, 20-A1$c$. The adjustment column 20-A1$a$ can have a cylindrical or trapezoidal structure. The trapezoidal adjustment columns have two types: 20-A1$b$, and 20-A1$c$. About the adjustment column 20-A1$b$, its maximum width of the side adjacent to the opponent member 20-BO is smaller than the maximum width of another side away from the opponent member 20-BO. About the adjustment column 20-A1$c$, its maximum width of the side adjacent to the opponent member 20-BO It is greater than the maximum width of the side far from the opponent member 20-BO.

Figure 7:
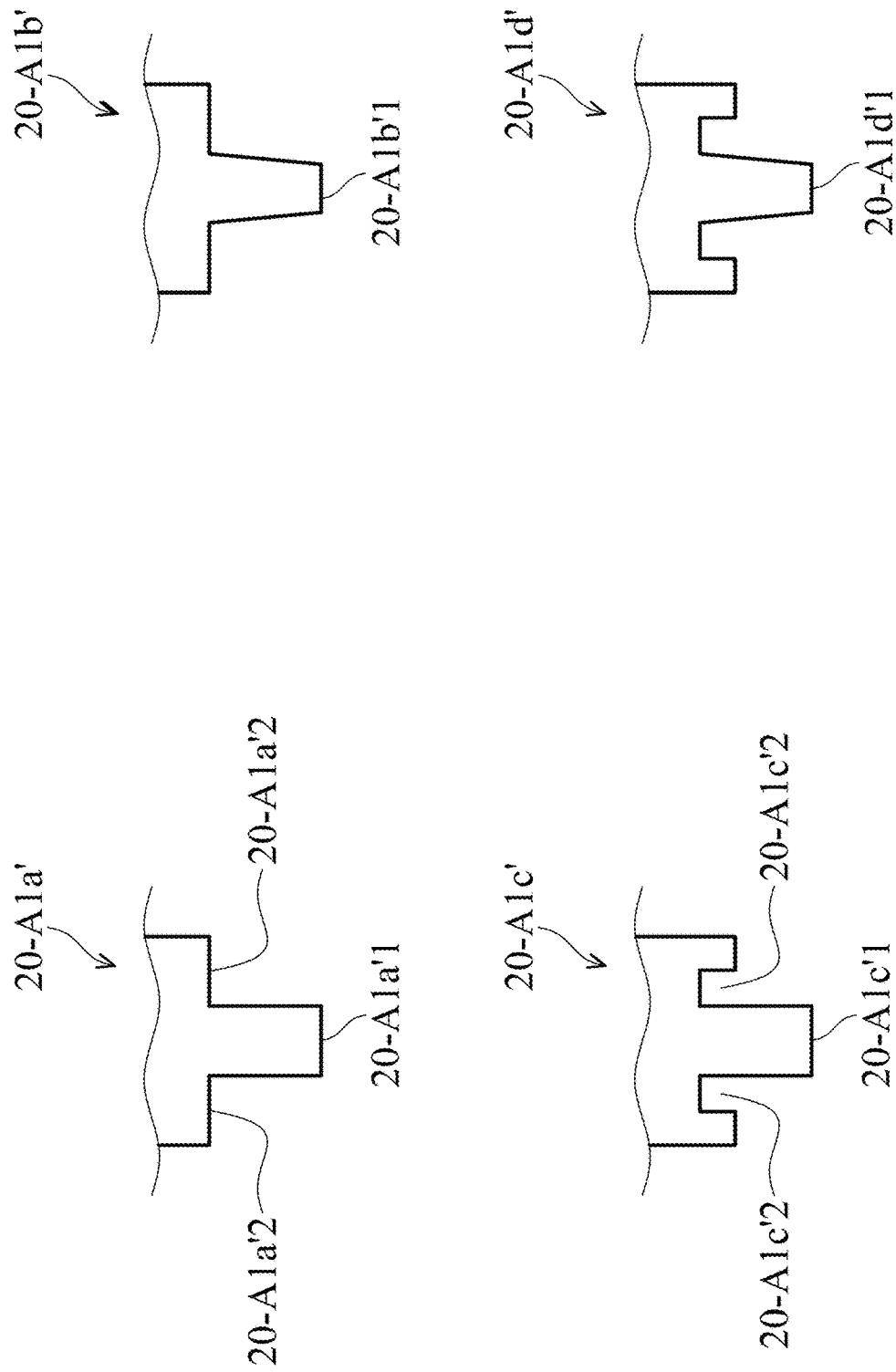
FIG. 7 is a schematic diagram showing a plurality of adjusting columns having different shapes.

FIG. 7 shows a schematic view of the ends of a plurality of different adjusting columns 20-A1 (or 20-A2) having different shapes, such as adjusting columns 20-A1$a'$, 20-A1$b'$, 20-A1$c'$ and 20-A1$d'$. The end of the adjustment column 20-A1$a'$ has a stepped structure to form an extension 20-A1$a'$1 and a limiting surface 20-A1$a'$2. When the opponent member 20-BO is pressed against the extension 20-A1$a'$1 to change the shape of the column 20-A1$a'$, the limiting surface 20-A1$a'$2 can be used as a surface that limits the opponent member 20-BO doing excessive movement, which can prevent the opponent member 20-BO from overly pressing the adjustment column 20-A1$a'$. The extension portion 20-A1$b'$1 of the adjustment column 20-A1$b'$ has a tapered structure.

The adjustment column 20-20-A1$c'$ has an extension portion 20-A1$c'$1 and a depression portion 20-A1$c'$2, and the depression portion 20-A1$c'$2 is located on both sides of the extension portion 20-A1c'1. When the opponent member 20-BO is pressed against the extension portion 20-A1c'1 to change the shape of the column 20-20-A1c', the deformed extension portion 20-A1c'1 can move toward the depression portion 20-A1c'2, wherein the depression portion 20-A1c'2 has a space to accommodate deformation of the extension 20-A1c'1. The extension portion 20-A1d'1 of the adjustment column 20-A1d'1 has a tapered structure.

In summary, an embodiment of the present invention provides a camera module optical system, having a main axis, including an optical module and an adjustment assembly. The optical module is configured to hold an optical element having an optical axis. The adjustment assembly is configured to adjust the optical axis of the optical module parallel to the main axis. The optical module and the adjustment assembly are arranged along the main axis, wherein the adjustment assembly does not overlap the optical module when viewed in a first direction that is perpendicular to the main axis.

The embodiment of the present invention has at least one of the following advantages or effects. Through the adjustment assembly, a plurality of optical modules can be aligned with each other, and one or more optical modules and an image sensor module can be aligned with each other, so as to improve the quality of the device. In addition, since the adjustment assembly can change its shape during adjustment process (usually being squeezed and reduced in height in the vertical direction), the adjustment between the optical module and the image sensor module can be more accurate and greatly improved product quality.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:

1. A camera module optical system, having a main axis, comprising:
    an optical module, configured to hold an optical element having an optical axis; and
    an adjustment assembly, configured to adjust the optical axis of the optical module parallel to the main axis, wherein the optical module and the adjustment assembly are arranged along the main axis, and the adjustment assembly does not overlap the optical module when viewed in a first direction that is perpendicular to the main axis,
    wherein the adjustment assembly includes a plurality of adjustment columns, the adjustment columns each has:
        a first protrusion, protruding from a first surface of the optical module; and
        an extension, protruding from a limiting surface of the first protrusion, wherein the first surface is parallel to the limiting surface, and the first surface is distanced from the limiting surface in the direction that is perpendicular to the first surface, and
    wherein the camera module optical system further comprises an image sensor module, wherein between the optical module and the image sensor is a space, and the adjustment assembly is located within the space.

2. The camera module optical system as claimed in claim 1, wherein the optical module includes a movable portion and a base, and the movable portion has a holder and a driving assembly, wherein the holder is configured to sustain the optical element, and the driving assembly is configured to drive the holder to move relative to the base.

3. The camera module optical system as claimed in claim 1, wherein the optical module has a bottom surface, and the adjustment assembly is located on the bottom of the optical module.

4. The camera module optical system as claimed in claim 1, wherein the optical module, the adjustment assembly and the image sensor module are sequentially arranged along the main axis.

5. The camera module optical system as claimed in claim 1, wherein the plurality of adjustment columns extend along a second direction, and the second direction is not perpendicular to the optical axis.

6. The camera module optical system as claimed in claim 1, wherein the adjustment assembly includes at least three adjustment columns which are located on different sides of a bottom surface of the optical module, and are disposed at edges of the bottom surface.

7. The camera module optical system as claimed in claim 5, wherein the adjustment columns have a cylindrical or trapezoidal structure.

8. The camera module optical system as claimed in claim 4, wherein the image sensor module has a contact surface, the adjustment assembly is located between the optical module and the contact surface, and the adjustment assembly contacts the contact surface.

9. The camera module optical system as claimed in claim 8, wherein the contact surface has a metal material.

10. The camera module optical system as claimed in claim 8, wherein the contact surface is flat.

11. The camera module optical system as claimed in claim 8, wherein the contact surface has a plurality of protrusions extending toward the optical module, the adjustment assembly corresponds to and contacts the protrusions, and a maximum width of each protrusion is greater than a maximum width of the adjustment assembly.

12. The camera module optical system as claimed in claim 8, wherein the contact surface has a plurality of recesses, and openings of the recesses face the optical module, the adjustment assembly corresponds to and contacts the recesses, and a maximum width of each recess is greater than a maximum width of the adjustment assembly.

13. The camera module optical system as claimed in claim 4, further comprising an assembly and adjustment mechanism that clamps the optical module and carries the image sensor module, wherein the assembly and adjustment mechanism applies a force to the image sensor module toward the optical module, and adjusts the shape of the adjustment assembly, so that the optical axis is parallel to the main axis.

14. A camera module optical system, having a main axis, comprising:
    a first optical module, configured to carry a first optical element having a first optical axis;
    a second optical module, configured to carry a second optical element having a second optical axis; and
    an adjustment assembly, configured to adjust the first optical axis and the second optical axis parallel to the main axis, and includes an adjustment sub-assembly located between the first optical module and the second optical module, wherein when viewed from a first direction that is perpendicular to the main axis, the first adjustment sub-assembly does not overlap the first optical module or the second optical module, wherein the adjustment assembly includes a plurality of adjustment columns, the adjustment columns each has:
- a first protrusion, protruding from a first surface of the optical module; and
- an extension, protruding from a limiting surface of the first protrusion, wherein the first surface is parallel to the limiting surface, and the first surface is distanced from the limiting surface in the direction that is perpendicular to the first surface, and wherein between the first optical module and the second optical module is a space, and the adjustment assembly is located within the space.

15. The camera module optical system as claimed in claim 14, further comprising an image sensor module, the image sensor module has the main axis, and the adjustment assembly further includes a second adjustment sub-assembly, wherein the first optical module, the second optical module, and the image sensor module are sequentially arranged along the main axis, the second adjustment sub-assembly is located between the second optical module and the image sensor module, and is configured to adjust the second optical axis parallel to the main axis, wherein when viewed along the first direction perpendicular to the main axis, the second adjustment sub-assembly does not overlap the second optical module.

16. The camera module optical system as claimed in claim 14, wherein the first adjustment sub-assembly is disposed on an upper surface of the second optical module and at least partially contacts a bottom surface of the first optical module, and the upper surface and the bottom surface face each other.

17. The camera module optical system as claimed in claim 14, wherein the first adjustment sub-assembly is disposed on a bottom surface of the first optical module, and at least partially contacts an upper surface of the second optical module, and the bottom surface and the upper surface face each other.

18. The camera module optical system as claimed in claim 14, wherein the second adjustment sub-assembly is disposed on a lower surface of the second optical module and at least partially contacts a surface of the image sensor module, and the lower surface and the surface of the image sensor module face each other.

19. The camera module optical system as claimed in claim 14, further comprising an assembly and adjustment mechanism for adjusting the shape of the adjustment assembly and to make the first optical axis and the second optical axis parallel to the main axis.

* * * * *